(12) United States Patent
Chen

(10) Patent No.: US 7,612,610 B2
(45) Date of Patent: Nov. 3, 2009

(54) ACTIVE INPUT LOAD WIDE BANDWIDTH LOW NOISE HEMT AMPLIFIER

(75) Inventor: Yaochung Chen, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 268 days.

(21) Appl. No.: 11/256,542

(22) Filed: Oct. 21, 2005

(65) Prior Publication Data

US 2007/0090879 A1   Apr. 26, 2007

(51) Int. Cl.
*H03F 3/16* (2006.01)
(52) U.S. Cl. .................. 330/277; 330/296; 330/302
(58) Field of Classification Search .......... 330/277, 330/285, 296, 302
See application file for complete search history.

(56) References Cited

U.S. PATENT DOCUMENTS

| | | | |
|---|---|---|---|
| 4,992,752 A | 2/1991 | Cioffi | |
| 5,361,038 A | 11/1994 | Allen et al. | |
| 5,550,513 A | 8/1996 | Wong | |
| 5,559,472 A | 9/1996 | Kobayashi | |
| 5,710,523 A | 1/1998 | Kobayashi | |
| 5,751,190 A | 5/1998 | Nguyen et al. | |
| 5,838,031 A | 11/1998 | Kobayashi et al. | |
| 5,920,230 A | 7/1999 | Beall | |
| 6,075,414 A * | 6/2000 | Nagaoka et al. | 330/277 |
| 6,094,099 A | 7/2000 | Kobayashi | |
| 6,642,794 B2 * | 11/2003 | Mulder et al. | 330/277 |

OTHER PUBLICATIONS

"Analysis of the Performance of Four-Cascaded Single-Stage Distributed Amplifiers," Ben Y. Banyamin and Michael Berwick, IEEE, 2000, pp. 2657-2663.

"Ultra-High Gain, Low Noise monolithic InP HEMT Distributed Amplifier From 5 to 40 GHz," Electronics Letters, Apr. 12, 1990, vol. 26, No. 8, pp. 515-516.

"2-18 GHz GaAs Monolithic Ultra-Broadband Amplifier," Yu Lingli, Ding Kuizhang, and He Qingguo, IEEE, 1998, pp. 238-241.

"Ka-Band Multistage MMIC Low-Noise Amplifier Using Source Inductors with Different Values for Each Stage," Hiromitsu Uchida, et al. IEEE, 1999, pp. 71-72.

"A-6 to 18-GHz Two-Stage Distributed Low-Noise Amplifier Designed for High Yield," James Culver, et al., IEEE, 1990, pp. 301-304.

"Experimental Performance of Ultra-Broadband Amplifier Design Concept Employing Cascaded Reactively . . . ," Electronics Letters, Aug., 31, 2000, vol. 36, No. 18, pp. 1554-1556.

"High Efficiency Monolithic Gallium Nitride Distributed Amplifier," Bruce Green, et al., IEEE Microwave and Guided Wave Letters, vol. 10, No. 7, Jul., 2000, pp. 270-272.

"A Monolithic HEMT-HBT Direct-Coupled Amplifier with Active Input Matching," IEEE Microwave and Guided Wave Letters, vol. 6., No. 1, Jan., 1996.

"A 74-GHz Bandwidth InAlAs/InGaAs-InP HBT . . . ," Y. Baeyens, et al., IEEE Microwave and Guided Wave Letters, vol. 9, No. 11, Nov., 1999, pp. 461-463.

* cited by examiner

*Primary Examiner*—Khanh V Nguyen
(74) *Attorney, Agent, or Firm*—John S. Paniaguas; Katten Muchin Rosenman LLP

(57) ABSTRACT

A relatively wide bandwidth low noise amplifier with an active input matching network. The active load may be formed from a field effect transistor (FET) or high electron mobility transistor (HEMT) in a common gate configuration. The active load input matching network has a lower overall noise component to only transistor channel noise than reactive matching components, such as inductors and capacitors. By utilizing the active mode input matching network in accordance with the present invention, the circuit layout such amplifiers can be reduces significantly, for example, 23 mils × 47 mils.

11 Claims, 5 Drawing Sheets

ACTIVE INPUT LOAD WIDE BANDWIDTH LOW NOISE HEMT AMPLIFIER

BACKGROUND OF THE INVENTION

1. Technical Field

The present invention relates to a low noise wide band amplifier and more particularly to a low noise wide bandwidth amplifier with an active load input matching network which eliminates the need for relatively large reactive elements, such as inductors and capacitors, in order to minimize the amplifier layout area.

2. Description of the Prior Art

Distributed amplifiers are known to be used for relatively wide bandwidth applications. Examples of such distributed amplifiers are disclosed in U.S. Pat. Nos. 4,992,752; 5,361,038; 5,550,513; 5,559,472; 5,751,190; 5,920,230 and 6,094,099. Such distributed amplifiers are also well documented in the literature: "A 74 GHz Bandwidth InAlAs/InGaAs-InP HBT Distributed Amplifier with a 13-dB Gain" by Baeyens, et al. *IEEE Microwave and Guided and Wave letters*, Vol. 9, Issue 11, pages 461-463, November 1999; "High Efficiency Monolithic Gallium Nitride Distributed Amplifier", Green, et al., *IEEE Microwave and Guided Wave Letters*, Vol. 10, Issue 7, pages 270-272, July 2000; "Experimental Performance of Ultra Broadband Amplifier Design Concept Employing Cascaded Reactively Terminated Single Distributed Amplifier Configuration", Virdee, et al., *Electronic Letters*, Vol. 36, Issue 18, Pages 1554-1556, Aug. 31, 2000; and "Analysis of the Performance of Four Cascaded Single Stage Distributed Amplifiers", by Banyamin, et al, *IEEE Transactions on Microwave Theory and Techniques*, Vol. 48, Issue 12, Pages 2657-2653, December 2000.

Low noise wide band amplifiers are normally formed from Type III-IV semiconductors, such as GaAs and InP semiconductors, formed into one or more high electron mobility transistor (HEMT) or heterojunction bipolar transistor (HBT) gain cells for such distributed amplifiers. Examples of such low noise wide band amplifiers are disclosed in U.S. Pat. Nos. 5,710,523 and 5,838,031. Such low noise wide band amplifiers are also disclosed in: "6 to 18-GHz Two Stage Distributed Low Noise Amplifier Pesion For High Yield", Culver et al, *Twelfth Annual Gallium Arsenide Integrated Circuit (GaAs Ic) Symposium,* 1990 Technical Digest, Pages 301-304, Oct. 7-10, 1990; "Ultra High Gain, Low Noise Monolithic InP HEMT Distributed Amplifier from 5-40 GHz", *Electronic Letters, Vol.* 26, Issue 8, Pages 515-516, April 1990; "2-18 GHz GaAs Monolithic Ultra Broadband Amplifier", by Lingli et al, 1998 *International Conference on Microwave and Millimeter Wave Technology Proceeding*. ICMMT '98, pages 238-241, Aug. 18-20, 1998. "Ka-Band Multi Stage MMIC Low Noise Amplifier Using Source Inductors with Different Values for Each Stage", Uchida, et al, *IEEE Microwave Guided Wave Letters*, Vol. 9, Issue 2, Pages 71-72, Feb. 19, 1999.

Many known distributed amplifiers are known to include reactive matching elements, such as inductors and capacitors. Such inductors and capacitors are many times larger than the active transistor amplifying device, causing the amplifier layout to be relatively large. Moreover, reactively matched amplifiers are known to have a limited bandwidth, for example, 10%-20% bandwidth, because at each discrete frequency point across the amplifier bandwidth, a different value reactive element is needed to cancel out the reactive impedance portion of the active device itself. Moreover, such reactive matching elements are known to include a resistive component which adds to input losses in the amplifier and cause degradation in the noise performance in the amplifier.

In order to overcome these disadvantages, direct coupled amplifiers with active input matching have been developed, for example, as disclosed in; "A Monolithic HEMT-HBT Direct Coupled Amplifier with Arrive Input Matching", by Kobsyashi, e1 at. *IEEE Microwave and Guided Letters*, vol. 6, no. 1, pages 55-57, January 1996. In this application a common gate HEMT is used for arrive impedance matching of a URT amplifier configured as a Darlington pair. In this application, the common gate HEMT is directly coupled to the HBT amplifler. Thus, a wide band low noise amplifier is needed which provides relatively lower noise figure performance and ax the same time reduces the layout size of the amplifier relative to known wide band amplifiers.

SUMMARY OF THE INVENTION

The present invention relates to a relatively wide bandwidth low noise amplifier with an active input matching network. The active load maybe formed from a field effect transistor (FET) or high electron mobility transistor (HEMT) in a common gate configuration. The active load input matching network has a lower overall noise component and includes only transistor channel noise relative to the noise associated with reactive matching components, such as inductors and capacitors. By utilizing the active load mode input matching network in accordance with the present invention, the circuit layout of the amplifier can be reduced significantly, for example, to 23 mils×47 mils.

DESCRIPTION OF THE DRAWINGS

These and other advantages of the present invention will be readily understood with reference to the following specification and attached drawing wherein.

DETAILED DESCRIPTION OF THE PRIOR ART

The present invention relates to a low noise wide bandwidth amplifier which incorporates an active load input matching network in order to provide improved performance relative to wide band amplifiers which use reactive matching elements, such as inductors and capacitors, and also allows the layout of the amplifier to minimized. More particularly, the active load input matching network is used in place of relatively large reactive matching circuit elements. Another advantage of the invention is that the active load input matching network has a lower overall noise figure than an equivalent lossy reactive matching network since the only noise source in the active load input matching network transistor channel noise source. In contrast, lossy reactive components are subject to thermal noise that is much larger than the intrinsic channel noise of a transistor. As such, the active load matching network in accordance with the present mention has lower overall noise performance than amplifiers which utilize corresponding lossy reactive matching elements.

As will be discussed in more detail below, the wideband amplifier, in accordance with the present invention, includes a field effect transistor (FET) or for low noise applications a first high electron energy transistor (HEMT) in a common source configuration with active load matching provided by a second HEMT configured with a common gate coupled to the drain terminal of the first HEMT. The active load matching transistor has relatively wider band frequency performance than known wide band amplifiers which utilize reactive matching elements because at low frequencies, the common gate active load emulates a nearly ideal 50 ohm impedance where the intrinsic transistor impedance is in the mega ohm region. In contrast, the impedance of known wideband amplifiers with lossy reactive matching elements varies with frequency causing the amplifier input impedance to be poor outside the matched frequency region. In addition, at higher frequencies, the active input load appears more like an open circuit so that the intrinsic FET/HEMT impedance dominates at higher frequencies.

Figure 1:
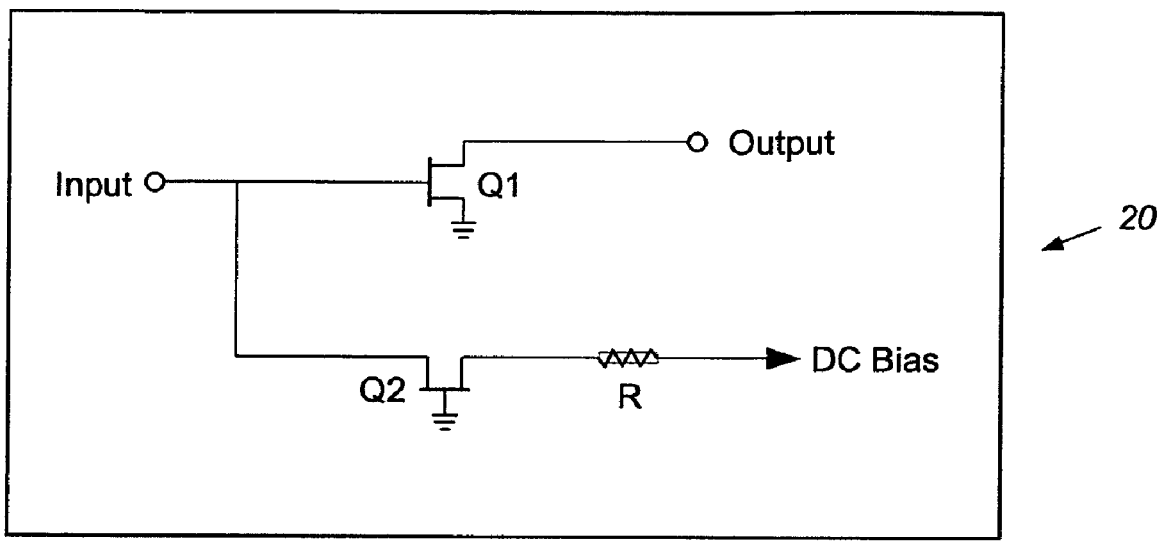
FIG. 1 is a schematic diagram of the active load input matching network in accordance with the present invention.

Turning to FIG. 1, an active load input matching network in accordance with the present invention is illustrated and generally identified with the reference numeral 20. The active input load network 20 includes a common gate FET or HEMT for low noise applications Q2, used as an active input load for a common source device, another FET/HEMT, Q1. The active input load matching network 20 also includes a serially connected resistor R. At frequencies near or below 10 GHz, the input impedance the transistor Q1 is relatively high while the transistor Q2 and the resistor R in series present a finite impedance.

There are several advantages of the active input load of the matching network 20. For example, the measured S-parameter S22 (i.e. output reflection coefficient) can be optimized, by adjusting the size of the transistor Q1. In particular, the S-parameter S22 is determined by the drain to source resistance $R_{ds}$ of the transistor Q1 whose size can be adjusted to be close to 50 ohms. The S-parameter S11 (i.e. input reflection coefficient) performance can also be optimized by adjusting the size of the transistor Q2 and the resistor R. In particular, the size of the resistor R can be used as a tradeoff between the S-parameter S11 performance and the noise figure. Moreover, using a small active low transistor Q2 as an active input mode generates less noise than a resistor of equivalent resistance. Other advantages of the active input load matching network over wideband amplifiers using reactive load matching elements is that the active load matching circuit 20 requires a minimum matching network and therefore can be configured in a relatively compact chip layout, especially at frequencies below 10 GHz. Compact chip layouts are crucial for low cost commercial monolithic microwave integrated circuits (MMIC). In addition, the active input load using a common gate device provides better gain and input return loss than lossy input loads.

Figure 2:
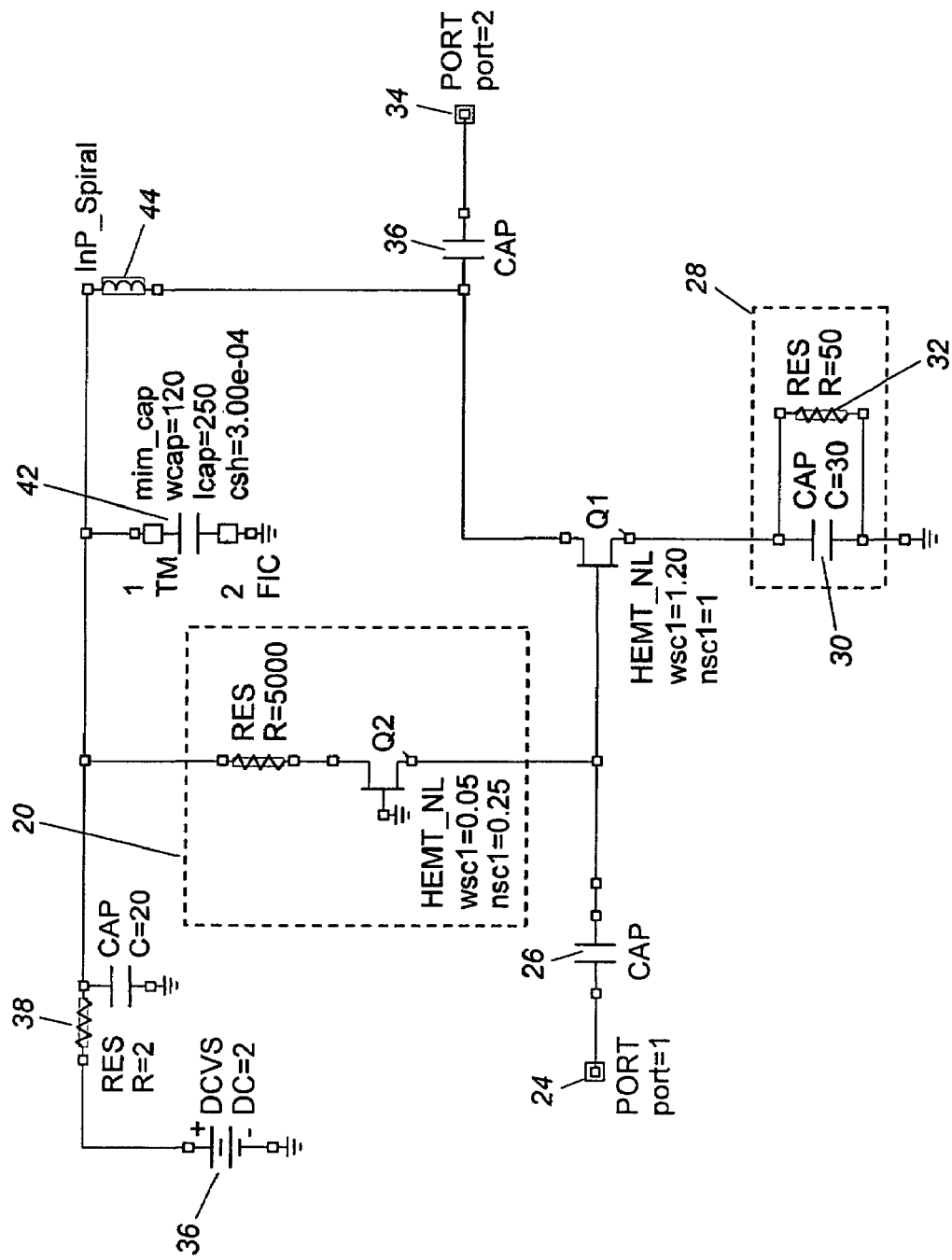
FIG. 2 is a schematic diagram of a wideband low noise amplifier incorporating an active load matching network in accordance with the present invention.

An exemplary low noise wide bandwidth amplifier incorporating the principles of the present invention is illustrated in FIG. 2 and generally identified with the reference number 22. The wide band amplifier includes a common source FET or HEMT gain transistor Q1. The gate terminal of the transistor Q1 is connected to an input port 24 by way of a coupling capacitor 26. The drain terminal of the transistor Q1 is connected to an output port 34 by way of a coupling capacitor 36. The source terminal of the transistor Q1 is connected to ground by way of a passive impedance matching network 28. The impedance matching network is connected between the source terminal of the gain transistor Q1 and Q2 ground. The matching network 28 includes two passive devices connected in parallel, for example, a capacitor 30 and a resistor 32. Since the layout size of the matching network 28 is relatively small relative to the layout size of the transistor Q1, the loss contribution to the overall amplifier gain of the transistor Q1 is relatively small.

As discussed above, the amplifier 22 in accordance with the present invention utilizes an active load matching network which includes a active device, such as a FET or HEMT, in a common gate configuration. More particularly, the source terminal of the transistor Q2 is coupled to the gate terminal of the amplifier Q1. The drain terminal of the common gate configured active load matching transistor Q2 is coupled to the resistor R. The resistor R is also coupled to a DC biasing network which includes a DC voltage source 36, a resistor 38 and a bypass capacitor 40. The resistor 38 and the resistor R form a voltage divider relative to the DC voltage source 36 for biasing active load input matching transistor Q2. In addition to the load matching network 28, the amplifier 22 also includes a bypass capacitor 42 and an inductor. The inductor 44 is also coupled to the output port 34 by way of the coupling capacitor 36.

Figure 3:
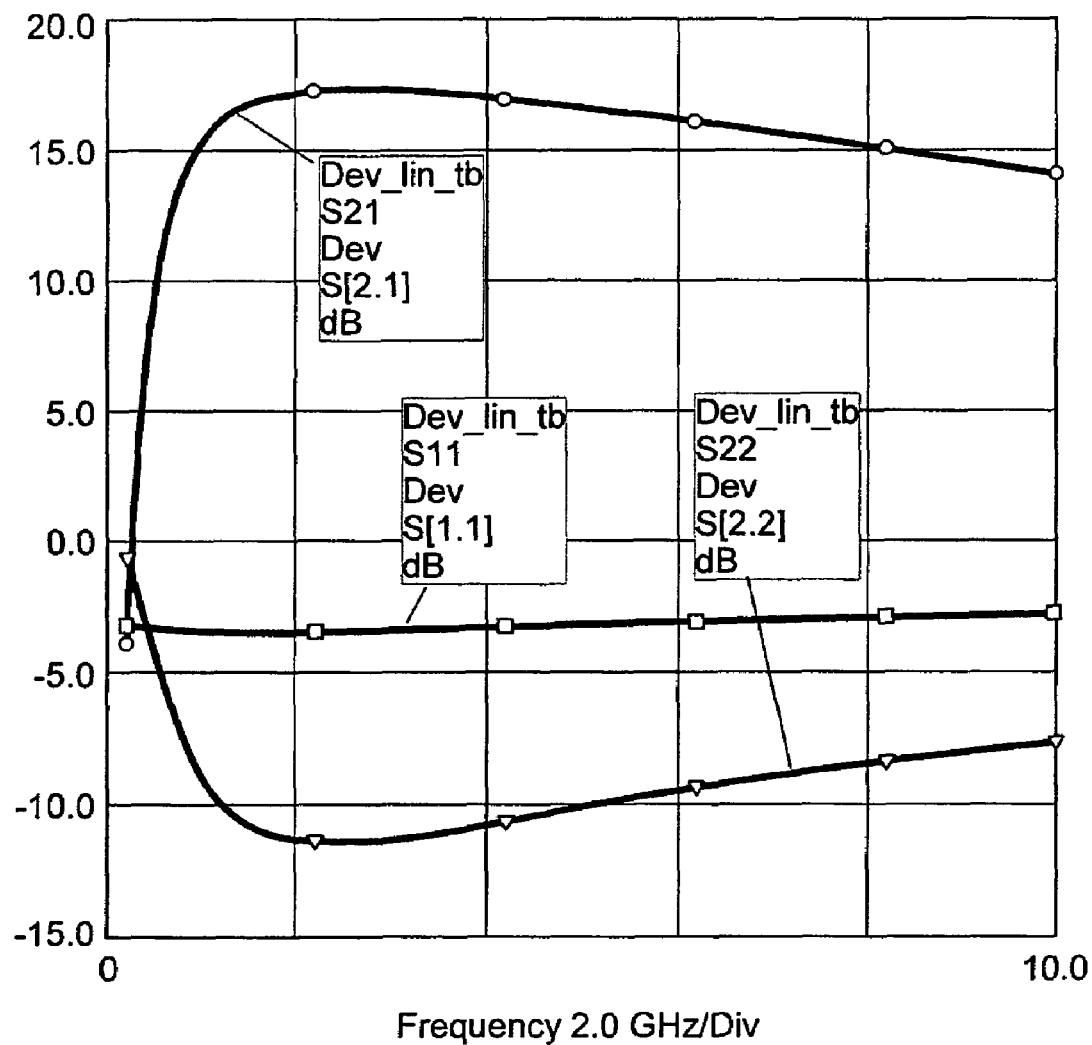
FIG. 3 is a graphical illustration illustrating the S11, S21 and S22 performance as a function of frequency of the wideband amplifier illustrated in FIG. 2.
Figure 4:
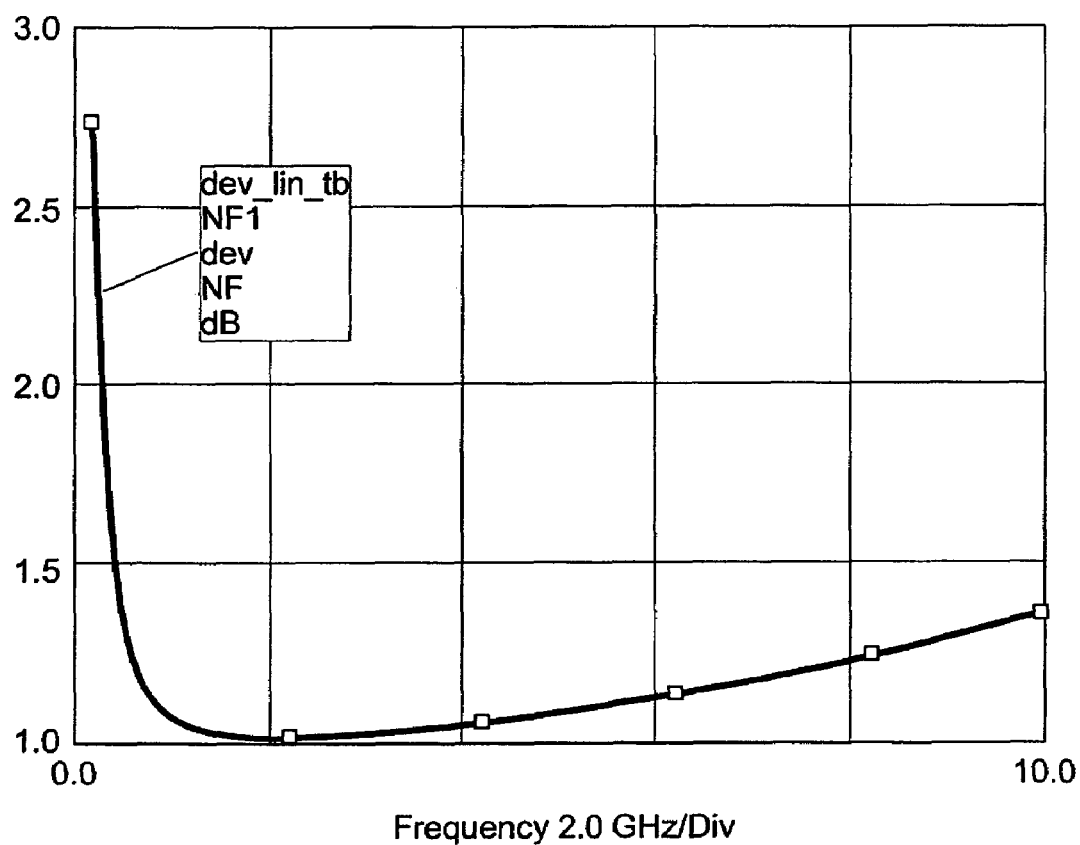
FIG. 4 is a graphic illustration of the noise factor performance as a function of frequency for the wideband amplifier illustrated in FIG. 2.

FIG. 3 illustrates the S-parameter performance for the S-parameters S11, S21 and S22 for the low noise wide band amplifier 22 illustrated in FIG. 2. As shown, the amplifier 22 provides better than 14 dB gain up to 10 GHz above 2 GHz. FIG. 4 illustrates the noise figure performance for the amplifier illustrated in FIG. 2. As shown, for frequencies greater than about 1 GHz, the noise figure performance is relatively linear and is less than 1.5 dB up to 10 GHz.

Figure 5:
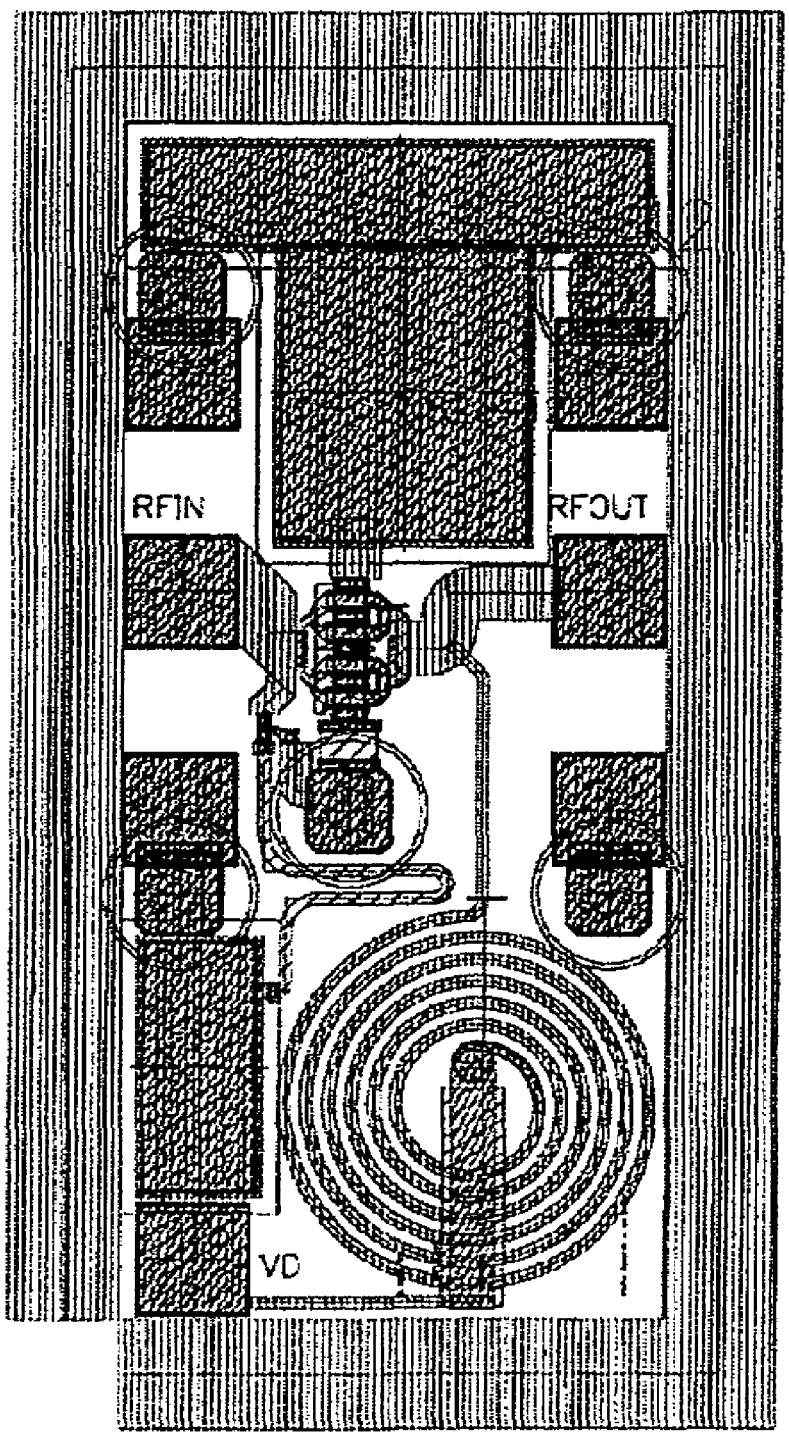
FIG. 5 is an exemplary circuit layout for the wideband amplifier illustrated in F*ig.* 2.

As mentioned above, the main advantage of the wide band low noise amplifier 22 is that it enables the chip layout to be minimized. An exemplary chip layout is illustrated in FIG. 5. For the exemplary circuit illustrated in FIG. 2, the circuit layout area is approximate 23 mills×47 mills including the inductor and on ship capacitors.

Obviously, many modifications and variations of the present invention are possible in light of the above teachings. Thus, it is to be understood that, within the scope of the appended claims, the invention may be practiced otherwise than as specifically described above.

I claim:

1. A wide band low noise amplifier comprising:
   a first high electron mobility transistor (HEMT), having a first gate, first source and first drain terminals connected in a common source configuration, said first gate defining an input port and said first drain defining an output port;
   a DC bias source ; and
   an active impedance circuit for providing input impedance matching of said first HEMT, said active impedance circuit including a second HEMT with second gate, second drain and second source terminals, said second HEMT configured in a common gate configuration and said second drain and said second source coupled between said first gate terminal and said DC bias source.

2. The wide band low-noise amplifier as recited in claim 1, wherein said active impedance circuit includes a second HEMT.

3. The wide band low noise amplifier as recited in claim 1, wherein said active impedance circuit includes a second HEMT with second gate, drain and source terminal and is configured with a common gate.

4. The wide band low noise amplifier as recited in claim 1, wherein said active impedance circuit includes a second HEMT, with second gate, drain and source terminal and is configured with a common gate; and
    a first resistance serially coupled to said second drain terminal.

5. The wide band low noise amplifier as recited in claim 1, wherein said active impedance circuit includes
    a first resistance serially coupled to said second drain terminal, wherein said first resistance that is electrically coupled to said output port.

6. The wide band low noise amplifier as recited in claim 1, wherein said active impedance circuit includes
    a first resistance serially coupled to said second drain terminal and said first resistance is electrically coupled to said output port and wherein said second source terminal is coupled to said first gate terminal.

7. A wide band low noise amplifier comprising:
a first high electron mobility transistor (HEMT), having first gate source and drain terminals configured as a common source;
an active impedance circuit for providing input impedance matching of said first HEMT;
    an input port coupled to said first gate terminal of said first HEMT; and
    an output port coupled to said first drain terminal of said HEMT, wherein said active impedance circuit includes a second HEMT with second gate, drain and source terminals and is configured with a common gate and further including;
a first resistance that is electrically coupled to said output port and wherein said second source terminal is coupled to said first gate terminal and wherein a DC bias source is electrically coupled to said first resistance.

8. A wide band low noise amplifier comprising:
a first high electron mobility transistor (HEMT), having first gate source and drain terminals configured as a common source;
an active impedance circuit for providing input impedance matching of said first HEMT;
    an input port coupled to said first gate terminal of said first HEMT; and
    an output port coupled to said first drain terminal of said HEMT, wherein said active impedance circuit includes a second HEMT with second gate, drain and source terminals and is configured with a common gate and further including:
a first resistance serially coupled to said second drain terminal, wherein said first resistance is also electrically coupled to said output port, and wherein second source terminal is coupled to said first gate terminal; and
a DC bias source electrically coupled to said first resistance, further including a passive impedance matching network.

9. A wide band low noise amplifier comprising:
a first high electron mobility transistor (HEMT), having first gate source and drain terminals configured as a common source;
an active impedance circuit for providing input impedance matching of said first HEMT;
    an input port coupled to said first gate terminal of said first HEMT; and
    an output port coupled to said first drain terminal of said HEMT, wherein said active impedance circuit includes a second HEMT with second gate, drain and source terminals and is configured with a common gate and further including;
a first resistance serially coupled to said second drain terminal, wherein said first resistance is also electrically coupled to said output port and wherein second source terminal is coupled to said first gate terminal;
a DC bias source electrically coupled to said first resistance; and
a passive impedance matching network, wherein said passive impedance matching network includes one or more passive impedance devices electrically coupled to said first source terminal.

10. A wide band low noise amplifier comprising:
a first high electron mobility transistor (HEMT), having first gate source and drain terminals configured as a common source;
an active impedance circuit for providing input impedance matching of said first HEMT;
    an input port coupled to said first gate terminal of said first HEMT; and
    an output port coupled to said first drain terminal of said HEMT, wherein said active impedance circuit includes a second HEMT with second gate, drain and source terminal and is configured with a common gate and further including;
a first resistance serially coupled to said second drain terminal, wherein said first resistance is also electrically coupled to said output port and wherein second source terminal is coupled to said first gate terminal;
a DC bias source electrically coupled to said first resistance;
a passive impedance matching network, wherein said passive impedance matching network includes one or more passive impedance devices electrically coupled to said first source terminal and wherein said one or more passive impedance devices include a second resistance and a first capacitance.

11. A wide band low noise amplifier comprising:
a first high electron mobility transistor (HEMT), having first gate source and drain terminals configured as a common source;
an active impedance circuit for providing input impedance matching of said first HEMT;
an input port coupled to said first gate terminal of said first HEMT; and
an output port coupled to said first drain terminal of said HEMT, wherein said active impedance circuit includes a second HEMT with second gate, drain and source terminals and is configured with a common gate and further including;
a first resistance serially coupled to said second drain terminal, wherein said active impedance network includes a second HEMT with second gate, drain and source terminals and is configured with a common gate, wherein said first resistance is also electrically coupled to said output port and wherein second source terminal is coupled to said first gate terminal;
a DC bias source electrically coupled to said first resistance;
a passive impedance matching network, wherein said passive impedance matching network includes one or more passive impedance devices electrically coupled to said first source terminal, wherein said one or more passive impedance devices include a second resistance and a first capacitance, wherein said second resistance and said first capacitance are coupled in parallel between said first source terminal and ground.

* * * * *

UNITED STATES PATENT AND TRADEMARK OFFICE
CERTIFICATE OF CORRECTION

| | | |
|---|---|---|
| PATENT NO. | : 7,612,610 B2 | Page 1 of 1 |
| APPLICATION NO. | : 11/256542 | |
| DATED | : November 3, 2009 | |
| INVENTOR(S) | : Yaochung Chen | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 536 days.

Signed and Sealed this

Nineteenth Day of October, 2010

David J. Kappos
*Director of the United States Patent and Trademark Office*